April 28, 1970 D. M. JACKSON, JR., ET AL 3,508,980

METHOD OF FABRICATING AN INTEGRATED CIRCUIT STRUCTURE WITH DIELECTRIC ISOLATION

Filed July 26, 1967

INVENTORS
Bernard W. Boland
Don M. Jackson Jr.

BY

Mueller, Aichele & Rauner

ATTYS.

United States Patent Office 3,508,980

Patented Apr. 28, 1970

3,508,980

METHOD OF FABRICATING AN INTEGRATED CIRCUIT STRUCTURE WITH DIELECTRIC ISOLATION

Don M. Jackson, Jr., and Bernard W. Boland, Scottsdale, Ariz., assignors to Motorola, Inc., Franklin Park, Ill., a corporation of Illinois Filed July 26, 1967, Ser. No. 656,215

Int. Cl. H01l 7/36, 7/50

U.S. Cl. 148—175 1 Claim

ABSTRACT OF THE DISCLOSURE

An integrated circuit structure with dielectric isolation is made by a process which involves the bonding of a "handle wafer" to a protected epitaxial film grown on a low resistivity substrate of the same conductivity type. The back side of the substrate is then thinned to about one mil, preferably by chemical etching. Isolated semiconductor islands or mesas are formed by selectively etching through the remaining substrate and epitaxial layer, followed by impurity diffusion or metallization to form highly conductive channels for surface collector contacts. The islands are then isolated by the formation of an oxide film and a "back-fill" of polycrystalline silicon, high temperature glass, or other ceramic material. The handle wafer is removed whereby the epitaxial portions of the semiconductor islands are exposed and prepared for device fabrication by light mechanical polishing to remove any surface damage.

BACKGROUND

Figure 1:
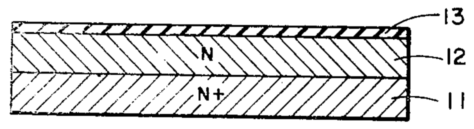
Figure 5:
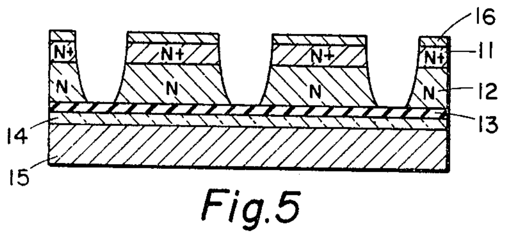

This invention relates to the fabrication of semiconductor structures and particularly to integrated circuits comprising an array of semiconductor islands separated by dielectric isolation.

Monolithic integrated circuits generally consist of a number of active devices such as transistors and diodes formed in a single semiconductor crystal element, in combination with passive devices such as resistors and capacitors also formed in or on the same semiconductor element. These devices are interconnected into a circuit by a metallization pattern formed on an insulating film covering the surface of the semiconductor element. In order to avoid or minimize the undesirable interaction of the devices with one another it is necessary to provide isolation between the active regions or islands of the structure.

The most common means of electrically separating one region from another is known as p–n junction isolation, achieved by providing two oppositely oriented isolation junctions between each pair of active regions. When one junction is biased in the forward direction the other will be biased in the reverse direction. Thus, one of the junctions will be reverse biased under any given operating condition. Since a reverse biased junction has a very high D.C. resistance, interaction between adjacent devices is minimized except at very high frequencies.

More recently various methods have been proposed for the fabrication of integrated circuits wherein the semiconductor islands are isolated from each other by a grid-like pattern of dielectric insulation. Due to the physical proximity of elements in one conglomerate block, the ability to interconnect all of the devices with thin film wiring is preserved. Also preserved are the inherent advantages of batch fabrication techniques to produce identical circuits in large quantities, thereby providing the lowest per unit cost, and potentially the highest order of reliability. Dielectric isolation provides the additional advantage of reduced parasitic capacitance and higher frequency operation.

Various difficulties have been encountered, however, in the development of processes for integrated circuit fabrication with dielectric isolation. In addition to the substantially increased costs resulting from an increased number of processing steps, principal difficulties have involved the need for critically precise lapping and polishing as a means of achieving uniform thickness across the entire surface of a wafer, and the difficulty of achieving optimum transistor collector profiles.

THE INVENTION

Accordingly, it is a primary object of the present invention to eliminate the need for precise mechanical shaping in the manufacture of integrated circuits having dielectric isolation. It is a further object of the invention to provide a method of optimizing collector impurity profiles in the manufacture of integrated circuits with dielectric isolation.

It is a feature of the invention that the critically uniform thickness required from island to island is provided by epitaxial growth, which is inherently more amendable to precise control than is possible with methanical shaping techniques.

An additional feature of the invention is the deposition of a silicon carbide layer to protect the epitaxial film. The silicon carbide also serves to interrupt a subsequent etching step at the proper depth. The SiC can be easily removed later by heating the wafer in an oxidizing ambient. The SiC will be converted to $SiO_2$.

An additional feature of the invention is the bonding of a dummy substrate or "handle wafer" to the epitaxial layer which ultimately forms the critical region of the semiconductor islands. This can be a ceramic, single or polycrystalline silicon or a metal wafer—or even a suitable plastic.

An additional feature involves the provision of low series resistance collector contacts at the same surface with the emitter and base contacts, by forming highly conductive regions completely surrounding each semiconductor island and extending to the surface where contact means are provided. The highly conductive channel may be formed by diffusion of a suitable impurity, or by a metallization technique, preferably chromium deposition. The etched regions surrounding the semiconductor islands are then back-filled to provide dielectric isolation with a suitable glass, a ceramic and glass cement, or other ceramic insulation material. Polycrystalline silicon may also be deposited, in accordance with known techniques.

A method is provided which includes in combination the steps of selectively etching the back side of an epitaxial wafer to form discrete semiconductor islands or mesas, followed by impurity diffusion or metallization to form highly conductive channels for surface ohmic contacts with transistor collector regions. A pyrolytic oxide is deposited over the mesal surface, followed by isolation of the semiconductor islands by back-filling with polycrystalline silicon, high temperature glass, or other ceramic material.

The invention is embodied in a process for the fabrication of a semiconductor structure to be used in the manufacture of integrated circuits, comprising the steps of growing an epitaxial semiconductor film at least ½ micron thick on a low resistivity monocrystalline semiconductor substrate, forming a protective layer on said epitaxial film, bonding a dummy substrate to the protected epitaxial surface, thinning the original substrate by removing a substantial portion thereof from its backside, selectively etching a grid-like pattern in said substrate to form an array of semiconductor islands, forming highly conductive channels along the sides of said islands to provide for top collector contact means, coating the conductive channel with $SiO_2$, back-filling the etched pattern with a dielectric material, then removing said dummy substrate to expose the epitaxial regions of said semiconductor islands for the fabrication therein of semiconductor devices.

It is also feasible, in accordance with an alternate embodiment of the invention, to complete the diffusion of impurities to form diodes, transistor base regions and emitter regions, and to form diffused resistors, etc., in the epitaxial film before the step of forming a protective layer thereon. Otherwise, the above sequence of steps remains unchanged. In all subsequent processing steps of this embodiment, however, it is essential to avoid temperatures in excess of about 825° C., in order not to redistribute impurity profiles.

In accordance with a preferred embodiment the process includes, in addition to the above steps, the pyrolytic deposition of silicon carbide on the epitaxial layer prior to the bonding thereto of a dummy substrate. For example, the silicon carbide layer may be formed by exposing the substrate to the mixed vapors of silane and propane diluted with a carrier gas, or by other known techniques. The carbide layer serves to protect the epitaxial film surface and to interrupt the subsequent etching process at the proper depth. As little as 300 angstroms of silicon carbide is generally sufficient; however, best results are obtained by depositing a silicon carbide layer at least 500 angstroms thick.

In accordance with a further embodiment, the back-fill step is interrupted soon after the semiconductor islands are covered, and the back-fill material is mechanically lapped and polished to provide a planar surface, to which a second dummy substrate is bonded. The first dummy substrate is then removed, along with the silicon carbide layer, if present, to expose the epitaxial regions wherein the active circuit devices are to be or have been fabricated. The second dummy wafer thus becomes a permanent part of the structure, providing only the mechanical strength necessary to prevent breakage.

DRAWINGS

FIGS. 1–8 are enlarged cross-sectional views illustrating a sequence of steps used in the fabrication of a semiconductor structure in accordance with the method of the invention.

In FIG. 1 a passivated epitaxial semiconductor is represented. In a particular embodiment, substrate 11 is a low resistivity monocrystalline silicon wafer of N-type conductivity as produced by heavy doping with a donor impurity such as arsenic, for example. A substrate thickness of about 10 mils is generally suitable, although a thickness in the range of 7 to 20 mils or more may be used. A substrate resistivity from .001 to .03 ohm-centimeters is suitable with .005 to .01 being preferred.

Inadvertent nonuniformities in the thickness or taper of the substrate do not critically affect the device yield, as is true of some prior methods for the fabrication of integrated circuits with dielectric isolation. Uniform thickness is essential in epitaxial layer 12; however, thickness control during epitaxial growth is far more readily achieved than in the preparation of a substrate.

Protective layer 13 may consist of a thermal oxide, or an oxide formed by vapor deposition. Preferably, the epitaxial layer is protected by the pyrolytic deposition of silicon carbide.

Figure 2:
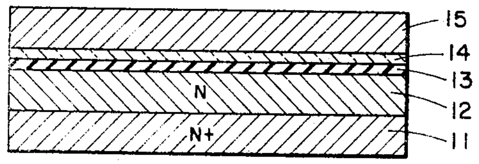

FIG. 2 illustrates the attachment of a dummy substrate 15 to epitaxial film 12 by means of bonding layer 14 which is preferably a glass or ceramic which softens at an appropriate temperature depending on when the diffusions are to be made. The dummy substrate may be scrap silicon or any conveniently available substance having at least approximately the same coefficient of thermal expansion as the semiconductor wafer. The sole function of substrate 15 is to serve as a "handle" for temporarily holding the semiconductor islands in place during intermediate processing steps. Substrate 15 is ultimately removed and discarded, or reused in subsequent processing runs. Bonding layer 14 is a suitable glass, ceramic, or plastic. If diffusion is to follow island formation, the glass or ceramic should soften preferably above 1200° C. in order that softening will not occur during the subsequent diffusion steps. Germanium temperatures are correspondingly lower.

Figure 3:
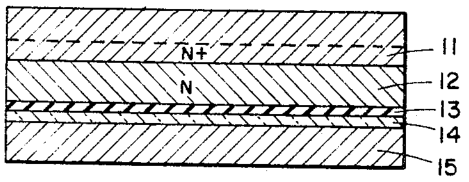

FIG. 3 represents the same structure as shown in FIG. 2 but in an inverted position. The shaded area of substrate 11 is then removed by any known procedure, preferably by chemical etching. The unshaded area of layer 11 which remains has a thickness of preferably about 15 microns. A thickness within the range of about 5 microns to 25 microns is suitable.

Figure 4:
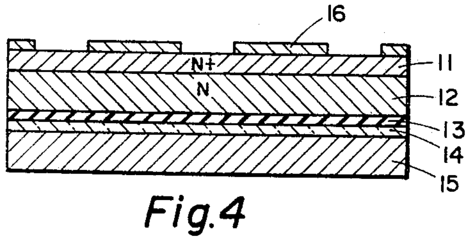

In FIG. 4 oxide layer 16 is formed on the etched surface of substrate 11. Again, this oxide layer may be formed by thermal oxidation or by vapor deposition. By selective etching, a grid-like pattern is cut in layer 16 leaving oxide patterns in the positions where semiconductor islands are to remain. The semiconductor islands are then formed by etching a moat pattern corresponding to the pattern cut from oxide layer 16. The moat etching is carried out in accordance with known procedures including, for example, contact with HF-$HNO_3$ mixtures in the case of silicon. The etching step is interrupted by protective layer 13. If layer 13 is silicon carbide, as in the preferred embodiment, the moat etchant will be more effectively stopped. Crystallographic orientation of the semiconductor and type of etchant will determine the side-wall topography of the islands.

Figure 6:
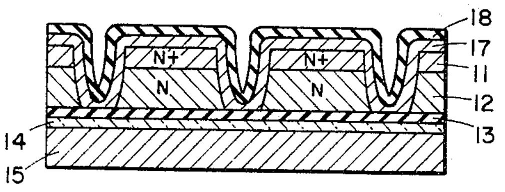

In FIG. 6 chromium or other suitable metal layer 17 is formed by any known technique, such as vacuum evaporation deposition. The chromium layer serves as a highly conductive region for the purpose of providing a low ohmic contact at the final island surface for the collector regions of transistors subsequently to be fabricated in the epitaxial layers of the semiconductor islands, or which have previously been formed.

As an alternative to chromium deposition or other metallization, the semiconductor islands may be subjected to high concentration diffusion with a suitable impurity, preferably the same impurity as was employed in doping substrate 11. Thus the periphery of the epitaxial portion of each semiconductor island is converted to a highly conductive region for establishing surface collector contacts. Oxide layer 18 is then formed to isolate the semiconductor islands. Oxide layer 18 may be former thermally in the event conductive channels 17 are formed by impurity diffusion. The oxide layer may also be formed by vapor deposition, the latter being required in the event conductive channels 17 are formed by metallization.

Figure 7:
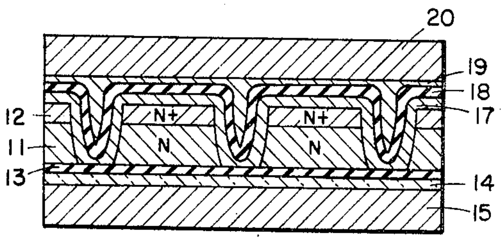

As shown in FIG. 7, the remaining grid-like pattern surrounding the semiconductor islands is back-filled to form glass, plastic, or other ceramic pattern 19. Region 19 may be fabricated to a sufficient thickness to provide all the necessary strength required of a permanent base structure. In the embodiment shown, however, growth of glass pattern 19 is interrupted as soon as the moat pattern is substantially filled. A substantially planar surface is then formed and a second dummy wafer of a suitable material is bonded to substrate 20 to form a permanent base for the integrated circuit structure.

Figure 8:
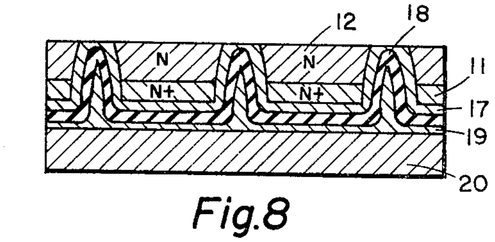

The structure is then reinverted and is shown in FIG. 8 after removal of dummy substrate 15 along with bonding layer 14 and passivation layer 13, whereby the epitaxial portions 12 of the semiconductor island are exposed for the purpose of fabricating semiconductor devices therein, or to complete the circuit through metal interconnections.

Although a particular embodiment has been described in which silicon is the semiconductor material, germanium devices may also be constructed in accordance with the invention, as well as III–V compound semiconductor devices. It will also be apparent that a semiconductor of P-type conductivity may be substituted for substrate 11, and that $p^+p$ structures may be fabricated in accordance with the invention. A combination of both n+ and p+ structures is also possible.

We claim:

1. A method for the fabrication of a semiconductor structure comprising the steps of:

(a) growing an epitaxial semiconductor film on a monocrystalline semiconductor substrate, (b) forming a layer of silicon carbide having a thickness of about 500 angstroms on said epitaxial film, (c) bonding a dummy substrate to the silicon carbide layer, (d) thinning the original substrate by removing a substantial portion thereof from its backside, (e) selectively etching a grid-like pattern in said substrate to form an array of semiconductor islands, (f) forming channels having a high conductivity relative to said substrate and epitaxial film along the sides of said islands to provide for top surface collector contact means, (g) backfilling the etched pattern with a dielectric material, and then (h) removing said dummy substrate and silicon carbide layer to expose the epitaxial regions of said semiconductor islands.

References Cited

UNITED STATES PATENTS

| | | | |
|---|---|---|---|
| 3,290,745 | 12/1966 | Chang. | |
| 3,316,128 | 4/1967 | Osafune et al. | |
| 3,313,013 | 3/1967 | Last. | |
| 3,320,485 | 5/1967 | Buie. | |
| 3,332,137 | 7/1967 | Kenney | 29—577 |
| 3,343,255 | 9/1967 | Donovan | 29—572 |
| 3,381,182 | 4/1968 | Thornton | 317—101 XR |
| 3,386,864 | 6/1968 | Silvestri et al. | 148—175 |
| 3,391,023 | 7/1968 | Frescura | 117—212 |
| 3,397,448 | 8/1968 | Tucker | 29—577 |
| 3,401,450 | 9/1968 | Godejahn | 29—580 |

L. DEWAYNE RUTLEDGE, Primary Examiner

R. A. LESIER, Assistant Examiner

U.S. Cl. X.R.

29—572, 578; 117—201; 148—174; 317—235